US008843333B2

(12) United States Patent
Tezuka et al.

(10) Patent No.: US 8,843,333 B2
(45) Date of Patent: Sep. 23, 2014

(54) NONAQUEOUS ELECTROLYTE SOLUTION TYPE LITHIUM ION SECONDARY BATTERY SYSTEM, METHOD FOR DETERMINING LITHIUM DEPOSITION IN THAT SYSTEM, AND VEHICLE PROVIDED WITH THAT SYSTEM

(75) Inventors: Takayoshi Tezuka, Nissin (JP); Teruo Ishishita, Miyoshi (JP); Ryo Mano, Toyota (JP); Junichi Matsumoto, Toyota (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 0 days.

(21) Appl. No.: 13/503,393

(22) PCT Filed: Mar. 31, 2011

(86) PCT No.: PCT/IB2011/000697
§ 371 (c)(1),
(2), (4) Date: Apr. 23, 2012

(87) PCT Pub. No.: WO2011/128743
PCT Pub. Date: Oct. 20, 2011

(65) Prior Publication Data
US 2012/0215472 A1 Aug. 23, 2012

(30) Foreign Application Priority Data
Apr. 12, 2010 (JP) ................. 2010-091151

(51) Int. Cl.
G01R 31/36 (2006.01)
B60L 11/18 (2006.01)

(52) U.S. Cl.
CPC ........... *G01R 31/3662* (2013.01); *Y02E 60/122* (2013.01); *Y02T 10/7011* (2013.01); *G01R 31/3679* (2013.01); *G01R 31/3634* (2013.01); *G01R 31/3658* (2013.01); *B60L 11/1851* (2013.01); *B60L 11/1857* (2013.01)
USPC .......................................................... 702/63

(58) Field of Classification Search
CPC ........... G01R 2013/00; G01R 2013/36; G01R 31/36; G01R 31/3651; G01R 31/3662; G01R 31/3675; G01R 31/3679
USPC .......................................................... 702/63
See application file for complete search history.

(56) References Cited

U.S. PATENT DOCUMENTS

2001/0028238 A1* 10/2001 Nakamura et al. ............. 320/132
2010/0036628 A1* 2/2010 Plestid ............................ 702/63
(Continued)

FOREIGN PATENT DOCUMENTS

JP 2009-63555 3/2009
JP 2009-199936 9/2009
(Continued)

OTHER PUBLICATIONS

Park et al., The Effect of Internal Resistance on Dendritic Growth on Lithium Metal Electrodes in the Lithium Secondary Batteries, Journal of Power Sources 178 (2008), 765-768.*
(Continued)

Primary Examiner — John Breene
Assistant Examiner — Timothy H Hwang
(74) Attorney, Agent, or Firm — Finnegan, Henderson, Farabow, Garrett & Dunner, LLP

(57) ABSTRACT

A battery system includes a discharge amount obtaining portion that obtains a discharge amount (determination zone discharge amount) from a determination start voltage until a predetermined determination end voltage of a battery; an internal resistance obtaining portion that obtains an internal resistance value of the battery; a correlation map in which a combination of internal resistance value information and determination zone discharge amount information for a battery that is the same kind as a target of a determination and in which lithium deposition has not occurred is stored for each degree of age-related deterioration of the battery; and a deposition determining portion that determines a degree of lithium deposition in the target battery by comparing the determination zone discharge amount during the determination of the target battery with the internal resistance value during the determination of the target battery on the same scale by converting at least one via the correlation map.

12 Claims, 8 Drawing Sheets

(56) References Cited

U.S. PATENT DOCUMENTS

| | | | |
|---|---|---|---|
| 2010/0156351 A1* | 6/2010 | Ugaji et al. | 320/132 |
| 2010/0194398 A1* | 8/2010 | Kawasumi et al. | 324/430 |
| 2013/0030739 A1* | 1/2013 | Takahashi et al. | 702/63 |

FOREIGN PATENT DOCUMENTS

| | | |
|---|---|---|
| JP | 2009-244088 | 10/2009 |
| JP | 2011-171213 | 9/2011 |

OTHER PUBLICATIONS

International Search Report in International Application No. PCT/IB2011/000697; Mailing Date: Aug. 23, 2011.

Written Opinion of the International Searching Authority in International Application No. PCT/IB2011/000697; Mailing Date: Aug. 23, 2011.

* cited by examiner

NONAQUEOUS ELECTROLYTE SOLUTION TYPE LITHIUM ION SECONDARY BATTERY SYSTEM, METHOD FOR DETERMINING LITHIUM DEPOSITION IN THAT SYSTEM, AND VEHICLE PROVIDED WITH THAT SYSTEM

CROSS-REFERENCE TO RELATED APPLICATIONS

This application is a national phase application of International Application No. PCT/IB2011/000697, filed Mar. 31, 2011, and claims the priority of Japanese Application No. 2010-091151, filed Apr. 12, 2010, the contents of both of which are incorporated herein by reference.

BACKGROUND OF THE INVENTION

1. Field of the Invention

The invention relates to a nonaqueous electrolyte solution type lithium ion secondary battery system in which the degree of lithium deposition in a nonaqueous electrolyte solution type lithium ion secondary battery is determined. More particularly, the invention relates to a nonaqueous electrolyte solution type lithium ion secondary battery system that determines lithium deposition based on measured data without taking the target battery apart, a method for determining lithium deposition in that system, and a vehicle provided with that system.

2. Description of the Related Art

In nonaqueous electrolyte solution type lithium ion secondary batteries to be used in vehicles and elsewhere, deposition of metallic lithium (hereinafter also referred to as "lithium deposition") may occur inside the battery as it is used. If a battery in such a state continues to be used as it is, it will adversely affect the original performance of the system. Therefore, it is necessary to ascertain the degree of lithium deposition in a nonaqueous electrolyte solution type lithium ion secondary battery.

Thus, Japanese Patent Application Publication No. 2009-63555 (JP-A-2009-63555) describes related art that attempts to determine whether there is lithium deposition. This technology calculates the power storage capacity of the battery in a running mode, and is then able to determine whether there is lithium deposition by comparing the calculated power storage capacity with the past power storage capacity. That is, when there is lithium deposition, the power storage capacity is lower than it is when there is no lithium deposition, so a determination as to whether there is lithium deposition is made by determining whether the power storage capacity has decreased.

However, aside from lithium deposition, age-related deterioration also results in a decrease in the power storage capacity. With the technology described in JP-A-2009-63555, it is difficult to clearly distinguish between these. Therefore, the determination accuracy of lithium deposition is comparatively low.

SUMMARY OF THE INVENTION

The invention thus provides a nonaqueous electrolyte solution type lithium ion secondary battery system capable of accurately determining the degree of lithium deposition in a nonaqueous electrolyte solution type lithium ion secondary battery in which deterioration has progressed, a method for determining lithium deposition in that system, and a vehicle provided with that system.

A first aspect of the invention relates to a nonaqueous electrolyte solution type lithium ion secondary battery system that includes a discharge amount obtaining portion, an internal resistance obtaining portion, a correlation map, and a deposition determining portion. The discharge amount obtaining portion obtains a determination zone discharge amount that is a discharge amount when a nonaqueous electrolyte solution type lithium ion secondary battery is discharged from a predetermined determination start voltage until a predetermined determination end voltage. The internal resistance obtaining portion obtains an internal resistance value of the nonaqueous electrolyte solution type lithium ion secondary battery. The correlation map is a map in which a combination of internal resistance value information and determination zone discharge amount information for a battery, the battery being a battery in which lithium deposition has not occurred and that is the same kind of battery as a target battery that is the nonaqueous electrolyte solution type lithium ion secondary battery for which a determination is to be made, is stored for each degree of age-related deterioration of the battery in which lithium deposition has not occurred. The deposition determining portion determines a degree of lithium deposition in the target battery by comparing the determination zone discharge amount obtained by the discharge amount obtaining portion when determining the degree of lithium deposition in the target battery with the internal resistance value obtained by the internal resistance obtaining portion when determining the degree of lithium deposition in the target battery on the same scale by converting at least one via the correlation map.

According to the structure described above, the degree of lithium deposition in the target battery is determined by comparing the information of the internal resistance value and the determination zone discharge amount at the time of the determination of the target battery using the correlation map. This correlation map maps out combinations of information of the internal resistance value and the determination zone discharge amount for a battery that is the same kind as the battery for which the determination is to be made and that has deteriorated only due to aging, not lithium deposition. Accordingly, the state of the target battery having no lithium deposition can be estimated by referencing this correlation map. Furthermore, if deterioration has progressed past the estimated state, it can be estimated that this deterioration is due to lithium deposition. Therefore, it is possible to determine the degree of lithium deposition by converting at least one of the obtained determination zone discharge amount and internal resistance value and comparing them on the same scale. As a result, the degree of lithium deposition in a nonaqueous electrolyte solution type lithium ion secondary battery in which deterioration has progressed can be accurately determined.

A second aspect of the invention relates to a vehicle provided with a nonaqueous electrolyte solution type lithium ion secondary battery system that includes a discharge amount obtaining portion that obtains a determination zone discharge amount that is a discharge amount when a nonaqueous electrolyte solution type lithium ion secondary battery is discharged from a predetermined determination start voltage until a predetermined determination end voltage; an internal resistance obtaining portion that obtains an internal resistance value of the nonaqueous electrolyte solution type lithium ion secondary battery; a correlation map in which a combination of internal resistance value information and determination zone discharge amount information for a battery, the battery being a battery in which lithium deposition has not occurred and that is the same kind of battery as a target battery that is the nonaqueous electrolyte solution type lithium ion secondary battery for which a determination is to be made, is stored for each degree of age-related deterioration of the battery in which lithium deposition has not occurred; and a deposition determining portion that determines a degree of lithium deposition in the target battery by comparing the determination zone discharge amount obtained by the discharge amount obtaining portion when determining the degree of lithium deposition in the target battery with the internal resistance value obtained by the internal resistance obtaining portion when determining the degree of lithium deposition in the target battery on the same scale by converting at least one via the correlation map.

Furthermore, in the nonaqueous electrolyte solution type lithium ion secondary battery system according to the first aspect and the vehicle according to the second aspect, the internal resistance obtaining portion may obtain the internal resistance value from a current value and a voltage value when discharging is performed in order to obtain the discharge amount by the discharge amount obtaining portion. Accordingly, it is possible to obviate the need to perform charging and discharging just to obtain the internal resistance value.

Moreover, the nonaqueous electrolyte solution type lithium ion secondary battery system according to the first aspect and the nonaqueous electrolyte solution type lithium ion secondary battery system provided in the vehicle according to the second aspect may also include a discharge-amount-when-new obtaining portion that obtains the determination zone discharge amount when the target battery is new. Also, the deposition determining portion may correct one of the determination zone discharge amount during the determination of the target battery, the internal resistance value during the determination of the target battery, and the correlation map, based on a determination-zone-discharge-amount-when-new that is the determination zone discharge amount obtained by the discharge-amount-when-new obtaining portion, in order to determine the degree of lithium deposition in the target battery. Accordingly, the determination can be made based on the performance of the target battery when new, so the determination for the target battery can be accurate even if there is some deviation in the performance of batteries of the same kind when new.

Furthermore, in the nonaqueous electrolyte solution type lithium ion secondary battery system according to the first aspect and the vehicle according to the second aspect, a decreased discharge amount that is a value of a difference between the determination-zone-discharge-amount-when-new and the determination zone discharge amount may be used as information of the determination zone discharge amount in the correlation map, and the deposition determining portion may determine the degree of lithium deposition in the target battery according to an increase or decrease amount that is a value of a difference between the decreased discharge amount when determining the degree of lithium deposition in the target battery and the information of the determination zone discharge amount read from the correlation map based on the internal resistance value when determining the degree of lithium deposition in the target battery. Moreover, the deposition determining portion may determine that the degree of lithium deposition is large when the increase or decrease amount is large, and determine that the degree of lithium deposition is small when the increase or decrease amount is small. Accordingly, the decrease amount due only to age-related deterioration, of the determination zone discharge amount, from the time the battery is new is matched with an internal resistance value and stored in the correlation map. Therefore, the decrease discharge amount is obtained from the correlation map based on the internal resistance value during the determination of the target battery, and then this decrease discharge amount is compared with the decrease discharge amount during the determination. As a result, the determination zone discharge amount and the internal resistance value can be compared on the same scale irrespective of the size of the determination zone discharge amount when the battery is new.

The nonaqueous electrolyte solution type lithium ion secondary battery system according to the first aspect and the nonaqueous electrolyte solution type lithium ion secondary battery system provided in the vehicle according to the second aspect may also include a correlation map storing portion in which the correlation map is stored.

In the nonaqueous electrolyte solution type lithium ion secondary battery system according to the first aspect and the vehicle according to the second aspect, the target battery may be the nonaqueous electrolyte solution type lithium ion secondary battery in which the determination zone discharge amount is obtained by the discharge amount obtaining portion and the internal resistance value is obtained by the internal resistance obtaining portion.

Furthermore, the vehicle according to the second aspect may also be provided with a voltage and current obtaining portion that measures a pair of a voltage value and a current value of the nonaqueous electrolyte solution type lithium ion secondary battery while the vehicle is running, and stores the obtained set. Also, when two or more of the sets are stored in the voltage and current obtaining portion, the internal resistance obtaining portion may obtain the internal resistance value based on the sets stored in the voltage and current obtaining portion, and in any other case, obtain a plurality of sets of voltage and current values by charging and discharging the nonaqueous electrolyte solution type lithium ion secondary battery while the vehicle is not running and obtain the internal resistance value based on those values. This structure makes it possible to minimize charging and discharging just for a diagnostic, as well as accurately determine the degree of lithium deposition.

Also, a third aspect of the invention relates to a method for determining lithium deposition in a nonaqueous electrolyte solution type lithium ion secondary battery system. This method includes preparing a correlation map in which a combination of internal resistance value information and determination zone discharge amount information for a battery, the battery being a battery in which lithium deposition has not occurred and that is the same kind of battery as a target battery, is stored for each degree of age-related deterioration of the battery in which lithium deposition has not occurred; obtaining a determination zone discharge amount and an internal resistance value when determining a degree of lithium deposition, for the target battery; and determining the degree of lithium deposition in the target battery by comparing the obtained determination zone discharge amount with the obtained internal resistance value on the same scale by converting at least one via the correlation map.

In the method for determining lithium deposition according to this aspect, the target battery may be a nonaqueous electrolyte solution type lithium ion secondary battery.

According to the nonaqueous electrolyte solution type lithium ion secondary battery system, the method for determining lithium deposition in that system, and a vehicle provided with that system of the invention, it is possible to accurately determine the degree of lithium deposition in a nonaqueous electrolyte solution type lithium ion secondary battery in which deterioration has progressed.

BRIEF DESCRIPTION OF THE DRAWINGS

The foregoing and further objects, features and advantages of the invention will become apparent from the following description of example embodiments with reference to the accompanying drawings, wherein like numerals are used to represent like elements and wherein.

DETAILED DESCRIPTION OF EMBODIMENTS

Hereinafter, an example embodiment of the invention will be described in detail with reference to the accompanying drawings. This example embodiment is technology for determining the degree of lithium deposition in a nonaqueous electrolyte solution type lithium ion secondary battery system (hereinafter simply referred to as a "battery system") provided with a nonaqueous electrolyte solution type lithium ion secondary battery (hereinafter simply referred to as a "battery").

Figure 1:
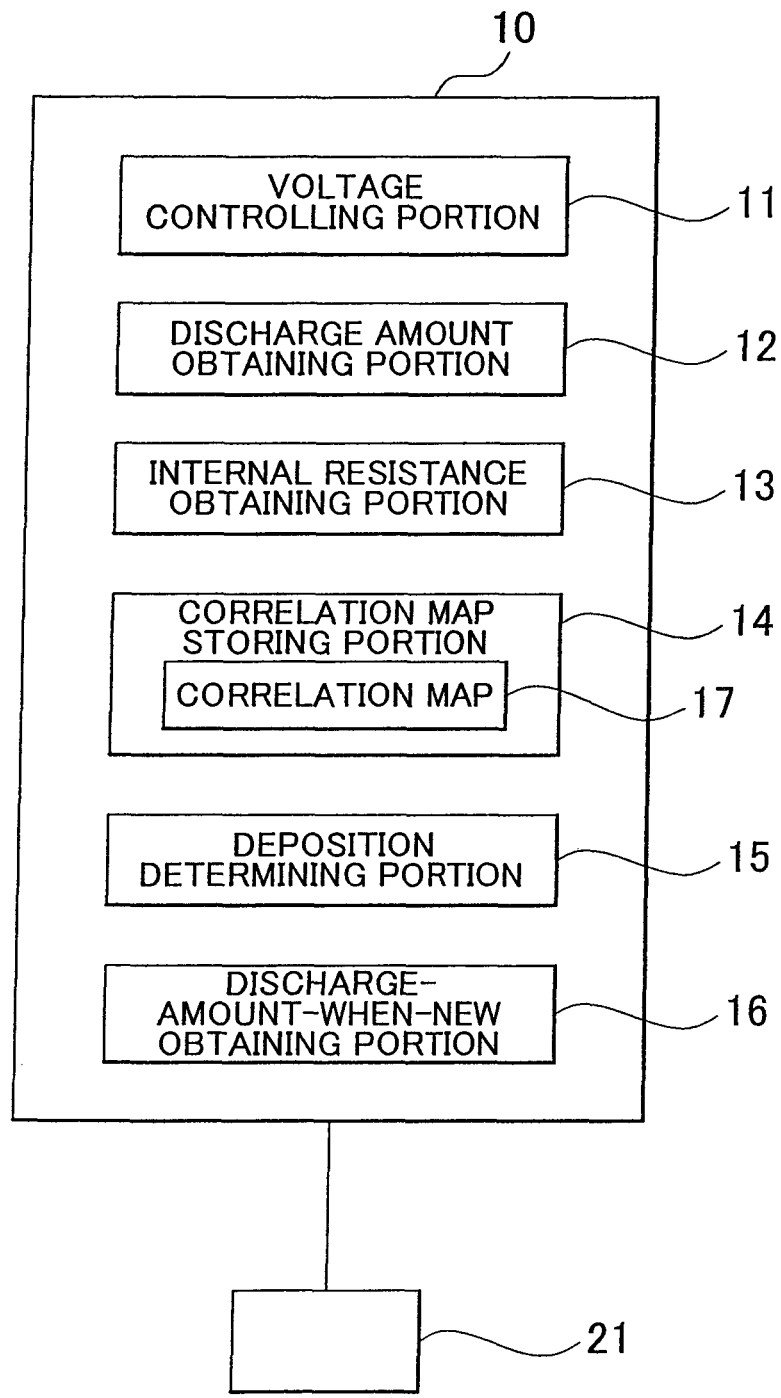
FIG. 1 is a block diagram of a battery system according to an example embodiment of the invention.

FIG. 1 is a view of the battery system 10 according to this example embodiment. The battery system 10 in FIG. 1 is connected to a battery 21 for which a determination is to be made (i.e., the determination target), and determines the degree of lithium deposition in the battery 21 without taking the battery 21 apart. Therefore, the battery system 10 in this example embodiment is able to discharge the connected battery 21 while controlling the voltage value and the current value.

In this example embodiment, the battery 21 is discharged until its voltage reaches a predetermined diagnostic end voltage Ve from a predetermined diagnostic start voltage Vs, and a discharge amount Q is obtained by integrating the current values during that time. This discharge amount Q is known to decrease due to deterioration of the battery 21. Also, another index indicative of the state of the battery 21 is an internal resistance value R. The internal resistance value R is also known to change due to deterioration. The internal resistance value R gradually increases as the battery 21 deteriorates.

Figure 2:
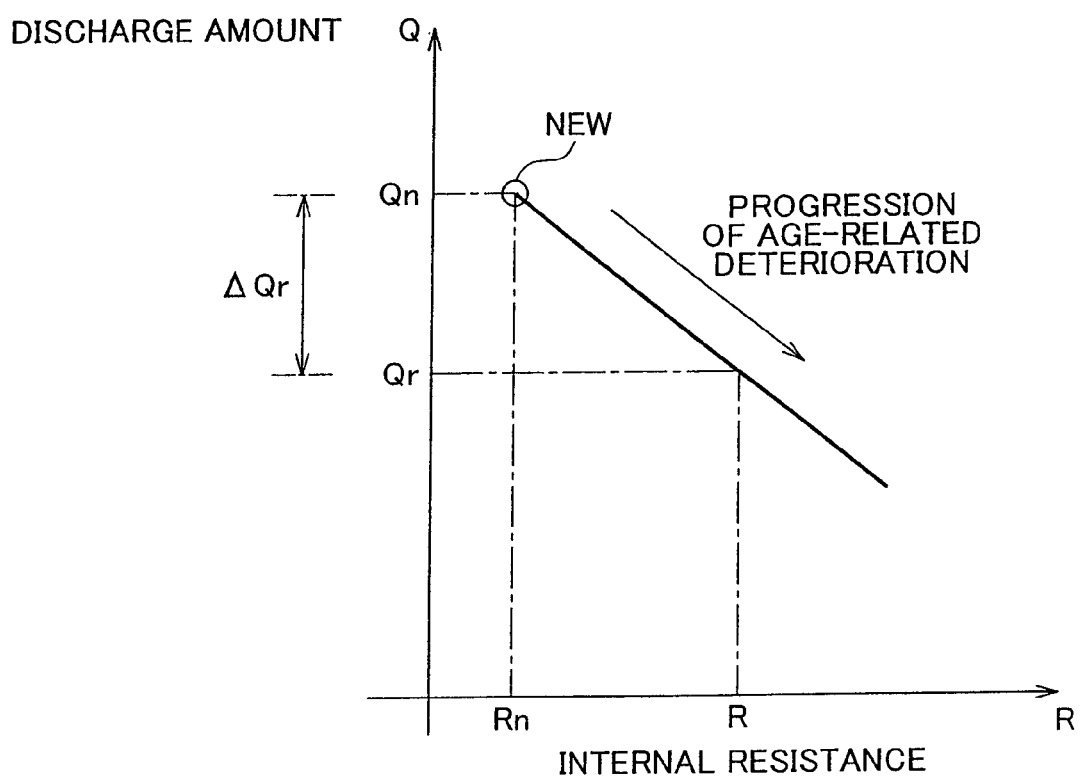
FIG. 2 is a graph of the relationship between an internal resistance value and discharge amount.

Age-related deterioration and lithium deposition are two major causes of deterioration of the battery 21. Age-related deterioration is deterioration that occurs due to the battery 21 aging without being used. However, the degree to which age-related deterioration progresses differs depending on the usage. This age-related deterioration progresses as the discharge amount Q decreases and the internal resistance value R increases, as shown in FIG. 2. On the other hand, deterioration due to lithium deposition essentially does not occur if the battery 21 is used continuously in an appropriate manner.

The inventors of the invention found that the amount of decrease in the discharge amount Q of the battery 21 in which lithium deposition has occurred is close to the sum of the amount of decrease due to age-related deterioration and the amount of decrease due to lithium deposition. That is, the degree of lithium deposition can be determined by subtracting, from the amount of decrease of the discharge amount Q from a given base point in time, the amount of decrease due to only age-related deterioration over that period. On one hand, the degree of increase in the internal resistance value R is almost unaffected by the existence or absence of lithium deposition. Therefore, the amount of decrease in the discharge amount Q due to only age-related deterioration is able to be gauged from the value of the internal resistance value R. Thus, the degree of lithium deposition can be determined by estimating the decrease in the discharge amount Q due to only age-related deterioration based on the value of the internal resistance value R, and then subtracting this from the total amount of decrease.

The battery system 10 of this example embodiment includes a voltage controlling portion 11, a discharge amount obtaining portion 12, an internal resistance obtaining portion 13, a correlation map storing portion 14, a deposition determining portion 15, and a discharge-amount-when-new obtaining portion 16, as shown in FIG. 1. Also, a correlation map 17 is stored in the correlation map storing portion 14. In the battery system 10 of this example embodiment, a correlation map 17 that is prepared in advance through testing for each type of battery 21 is stored in the correlation map storing portion 14.

In the battery system 10 in FIG. 1, the voltage controlling portion 11 obtains a voltage value of the battery 21 that is connected, and controls the starting and stopping and the like of discharge. In this example embodiment, the voltage controlling portion 11 discharges the battery 21 from a predetermined diagnostic start voltage Vs until a predetermined diagnostic end voltage Ve in order to make a determination for the battery 21. Discharging for this diagnostic is performed while controlling the current value so that it is a low current of an almost constant value (such as approximately 1 to 10 A, and more preferably, approximately 5 A). Incidentally, the diagnostic start voltage Vs and the diagnostic end voltage Ve are not particularly limited. For example, the diagnostic start voltage Vs may be set to a voltage that corresponds to a SOC (state-of-charge) of approximately 60%, and the diagnostic end voltage Ve may be set to a voltage that corresponds to a SOC of approximately 20 to 30%.

Figure 3:
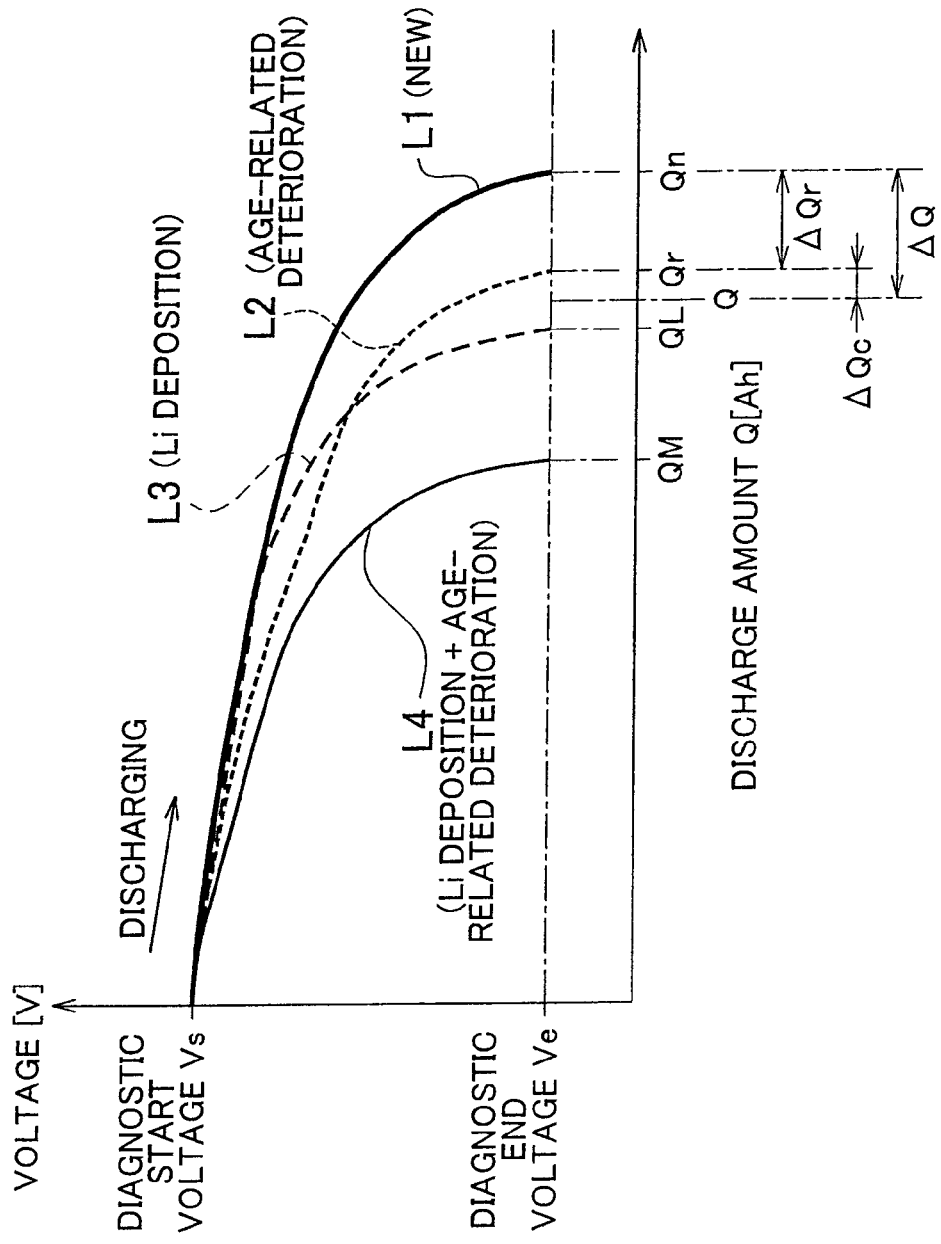
FIG. 3 is a graph of the relationship between the discharge amount and voltage value when the battery is discharged.

Also, the discharge amount obtaining portion 12 obtains the discharge amount Q by temporally integrating the current values of current discharged from the battery 21 while the battery 21 is being discharged from diagnostic start voltage Vs to diagnostic end voltage Ve according to the control of the voltage controlling portion 11. This discharge amount Q is a determination zone discharge amount. The discharge amount Q obtained by the discharge amount obtaining portion 12 in this example embodiment has a tendency such as that shown in FIG. 3, for example. In FIG. 3, the vertical axis represents the voltage value of the battery 21 and the horizontal axis represents the discharge amount until that time. The obtained discharge amount Q differs, as shown in the drawing, depending on the state of the battery 21.

Also, the internal resistance obtaining portion 13 obtains the internal resistance value R of the battery 21 at the time of the determination. The internal resistance value R is obtained from a set of values that includes a voltage value and a current value when the battery 21 is charged and discharged. For example, a plurality of sets of values, each set including a voltage value and a current value, may be obtained while the battery 21 is being discharged in order to obtain the discharge amount Q as described above, and the internal resistance value R may be calculated from these.

The correlation map 17 is stored in the correlation map storing portion 14, as shown in FIG. 1. This correlation map 17 will be described later. Also, the deposition determining portion 15 determines the degree of lithium deposition using the discharge amount Q obtained by the discharge amount obtaining portion 12, the internal resistance value R obtained by the internal resistance obtaining portion 13, and the correlation map 17. The method for this determination will also be described later.

Incidentally, when comparing the discharge amount Q as shown in FIG. 3, the base point in time may be when the battery 21 is new, because at this time it is certain that lithium deposition has not occurred. Therefore, in this example embodiment, the discharge-amount-when-new obtaining portion 16 is provided which obtains the discharge amount of the battery 21 when new (hereinafter this discharge amount will be referred to as the "discharge-amount-when-new Qn") for use as a reference value of the discharge amount Q. This discharge-amount-when-new Qn corresponds to the determination zone discharge amount when new.

As shown in FIG. 3, the discharge amount Q obtained by the discharge amount obtaining portion 12 differs depending on the state of the battery 21. When the battery 21 is new, the largest discharge-amount-when-new Qn is obtained with a discharge in a given (i.e., the same) voltage zone, as shown by the bold solid line L1 in the drawing. Also, the broken line L2 in the drawing shows an example of a battery in which only age-related deterioration has progressed and no lithium deposition has occurred (hereinafter referred to as an "age-deteriorated battery 21r"). Hereinafter, the discharge amount of this age-deteriorated battery 21r will be referred to as the age-related discharge amount Qr.

Also, the broken line L3 shows an example QL of a case that assumes a battery that has deteriorated due to only lithium deposition. Because age-related deterioration is unavoidable, and therefore a case in which age-related deterioration does not occur is not possible, such a case is not really possible. The discharge amounts Qr and QL of both examples are smaller than the discharge-amount-when-new Qn.

Also, when age-related deterioration and deterioration due to lithium deposition both progress fairly far, the discharge amount becomes a discharge amount QM that is even smaller than those indicated by the broken lines L2 and L3, as shown by the solid line L4 in FIG. 3. In such a state, the difference between the discharge-amount-when-new Qn and the discharge amount QM is the sum total of the portion due to age-related deterioration and the portion due to lithium deposition. Incidentally, the discharge amount Q at the time of the determination of the battery 21 due to average use is less than the discharge-amount-when-new Qn, and the same as or slightly less than the age-related discharge amount Qr of the same age, as shown in the example in the drawing.

In this example embodiment, the discharge amount obtaining portion 12 obtains the discharge amount Q, as well as the difference between the discharge-amount-when-new Qn that is obtained by the discharge-amount-when-new obtaining portion 16 and the discharge amount Q of the battery 21 at the time of the determination. This difference indicates the degree to which the discharge amount of the battery 21 has decreased due to use and aging. Below, this difference (i.e., the amount of decrease in the discharge amount Q) will be referred to as the decreased discharge amount ΔQ (see FIG. 3). This decreased discharge amount ΔQ is obtained by the expression below.

$$\Delta Q = Qn - Q \qquad \text{(Expression 1)}$$

Meanwhile, the amount of the discharge decrease amount ΔQ that is due to age-related deterioration is the discharge amount of the age-deteriorated battery 21r that is the same age as the battery 21, and is thus the age-related discharge amount Qr. The difference between the discharge-amount-when-new Qn and the age-related discharge amount Qr is an age-decreased discharge amount ΔQr shown in FIG. 3. This age-decreased discharge amount ΔQr is expressed by the expression below.

$$\Delta Qr = Qn - Qr \qquad \text{(Expression 2)}$$

The difference of the decreased discharge amount ΔQ obtained in Expression 1 minus the age-decreased discharge amount ΔQr obtained in Expression 2 is the amount of decrease in the discharge amount due to lithium deposition (hereinafter referred to as the "deposition-decreased discharge amount ΔQc"). As shown in FIG. 3, the difference between the decreased discharge amount ΔQ and the age-decreased discharge amount ΔQr is the deposition-decreased discharge amount ΔQc and is expressed by the expression below.

$$\Delta Qc = \Delta Q - \Delta Qr \qquad \text{(Expression 3)}$$

Of these, the age-decreased discharge amount ΔQr changes according to the internal resistance value R, as shown in FIG. 2. When the battery is new as shown at the upper left in the drawing, the discharge amount is the discharge-amount-when-new Qn and the internal resistance value is Rn. As age-related deterioration progresses, the internal resistance value R increases and the discharge amount Q decreases. The difference between the discharge-amount-when-new Qn and the age-related discharge amount Qr corresponding to the internal resistance value R is the age-decreased discharge amount ΔQr. Therefore, the age-decreased discharge amount ΔQr can be obtained from the internal resistance value R and the graph in FIG. 2.

Figure 4:
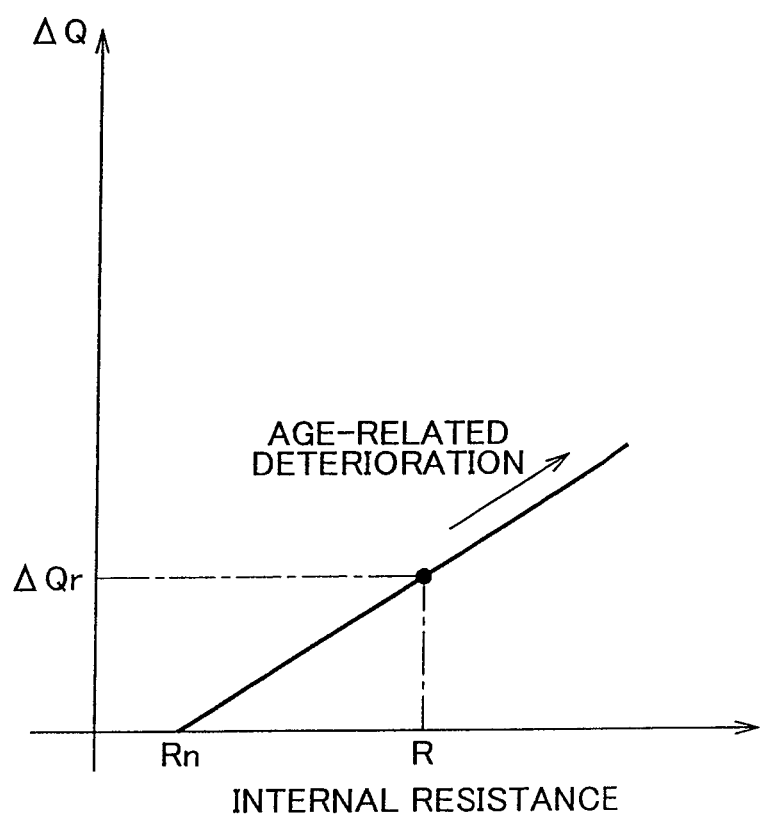
FIG. 4 is a graph of an example of a correlation map.

That is, there is a fixed correlative relationship, as shown in FIG. 4, between the internal resistance value R and the age-decreased discharge amount ΔQr. When the battery 21 is new, the internal resistance value R is Rn, and both the internal resistance value R and the age-decreased discharge amount ΔQr rise due to age-related deterioration. The correlation map 17 maps out this relationship. Incidentally, the shape of the graph in FIG. 4 is vertically reversed from that of the graph in FIG. 2, as is evident from Expression 3.

The correlation map 17 in this example embodiment maps out the relationship between the internal resistance value R and the age-decreased discharge amount ΔQr for the same type of battery as the battery 21. In this example embodiment, the correlation map 17 is prepared through testing or the like beforehand and stored in the correlation map storing portion 14. The deposition determining portion 15 in this example embodiment references this correlation map 17 to obtain the age-decreased discharge amount ΔQr that corresponds to the internal resistance value R obtained by the internal resistance obtaining portion 13.

Further, the deposition determining portion 15 in this example embodiment obtains the deposition-decreased discharge amount ΔQc, as in Expression 3, by taking the difference between the decreased discharge amount ΔQ obtained by the discharge amount obtaining portion 12 and the age-decreased discharge amount ΔQr obtained from the correlation map 17. The deposition determining portion 15 determines the degree of lithium deposition based on the size of this deposition-decreased discharge amount $\Delta Qc$. That is, the deposition determining portion 15 determines that the degree of lithium deposition is large when this value is large, and determines that the degree of lithium deposition is small when this value is small.

Incidentally, when it is determined by the deposition determining portion 15 that the amount of lithium deposition is larger than a reference value such as a predetermined threshold value, it is estimated that lithium deposition has progressed to an unacceptable level. The user may be prompted by a message or a warning on a display device or the like, for example, to change the battery 21 so that the battery 21 in this state will not continue to be used.

The determination by the battery system 10 in FIG. 1 is made according to four steps which are: Step 1. Measuring the discharge amount Q; Step 2. Obtaining the decreased discharge amount $\Delta Q$; Step 3. Obtaining the internal resistance value R; and Step 4. Determining the degree of lithium deposition. These steps will be described in order below.

In the first step of measuring the discharge amount Q (i.e., Step 1), the battery 21 is discharged from the diagnostic start voltage Vs until the diagnostic end voltage Ve, and the cumulative discharge amount Q during that time is obtained. To accomplish this, the voltage controlling portion 11 first obtains the current voltage value Vo of the battery 21 and discharges or charges the battery 21 until the voltage value Vo reaches the diagnostic start voltage Vs. Incidentally, the structure to accomplish this discharging or charging may also be included in the battery system 10. Alternatively, an apparatus capable of charging and discharging the battery 21 may be provided separately from the battery system 10.

When the voltage value Vo of the battery 21 has reached the diagnostic start voltage Vs, the voltage controlling portion 11 discharges the battery 21 until the voltage value Vo of the battery 21 matches the diagnostic end voltage Ve, while controlling the current value I to a constant value of a relatively low current. Then the discharge amount obtaining portion 12 multiplies the current value by the discharge time to obtain the discharge amount Q of the battery 21 at the time of the determination.

In the second step of obtaining the decreased discharge amount $\Delta Q$ (i.e., Step 2), the discharge amount obtaining portion 12 compares the discharge amount Q obtained in the first step (i.e., Step 1) with the discharge-amount-when-new Qn stored in the discharge amount obtaining portion 12, and obtains the decreased discharge amount $\Delta Q$ according to Expression 1 described above.

To accomplish this, when a new battery 21 is installed, the discharge-amount-when-new obtaining portion 16 in this example embodiment obtains a discharge amount according to the discharge from the diagnostic start voltage Vs to the diagnostic end voltage Ve before the new battery 21 starts to be used, and stores that obtained discharge amount in a device of the battery system 10. The method for obtaining the discharge-amount-when-new Qn is the same as that when the discharge amount Q is obtained by the discharge amount obtaining portion 12. Alternatively, before the battery 21 is installed in the battery system 10, the discharge-amount-when-new Qn of the battery 21 may be obtained in advance by the same method, and that obtained value may be stored in the discharge-amount-when-new obtaining portion 16. Or, if the same type of battery is used, there will be almost no individual difference according to the battery, in which case the value may be stored as a constant value according to the type of battery used.

In the third step of obtaining the internal resistance value R (i.e., Step 3), the internal resistance obtaining portion 13 obtains the internal resistance value R of the battery 21 at the time of the diagnostic. The internal resistance value of the battery gradually increases from when the battery is new due to the affects of the usage and the environment and the like. In this example embodiment, the internal resistance value R can be obtained using two or more sets of a voltage value and a current value obtained in the process of the first step (i.e., Step 1), for example. Incidentally, with the battery 21 that is mounted in a vehicle, an even more accurate measurement is possible by measuring the set of the voltage value and the current value continually (i.e., as needed) while running. The method for performing this measurement will be described later. Incidentally, the execution timing of this step is not limited as long as the step ends before the fourth step (i.e., Step 4) begins.

Next, in the fourth step of determining the degree of lithium deposition (i.e., Step 4), the deposition determining portion 15 reads the age-decreased discharge amount $\Delta Qr$ corresponding to the internal resistance value R obtained in the third step (i.e., Step 3) from the correlation map 17 stored in the correlation map storing portion 14. The correlation map 17 stores the mapped out relationship between the internal resistance value R and the age-decreased discharge amount $\Delta Qr$, as shown in FIG. 4, so the age-decreased discharge amount $\Delta Qr$ can be read based on the internal resistance value R obtained in the third step (i.e., Step 3).

The age-decreased discharge amount $\Delta Qr$ obtained here corresponds to the amount of decrease in the discharge amount due only to age-related deterioration with no lithium deposition, as shown in Expression 2. The decreased discharge amount $\Delta Q$ obtained in the second step (i.e., Step 2) is the sum of this and the amount of decrease in the discharge amount due to lithium deposition. Therefore, the deposition-decreased discharge amount $\Delta Qc$ of the amount corresponding to the amount of lithium deposition can be obtained, as shown in Expression 3 above, from the difference between these.

Figure 5:
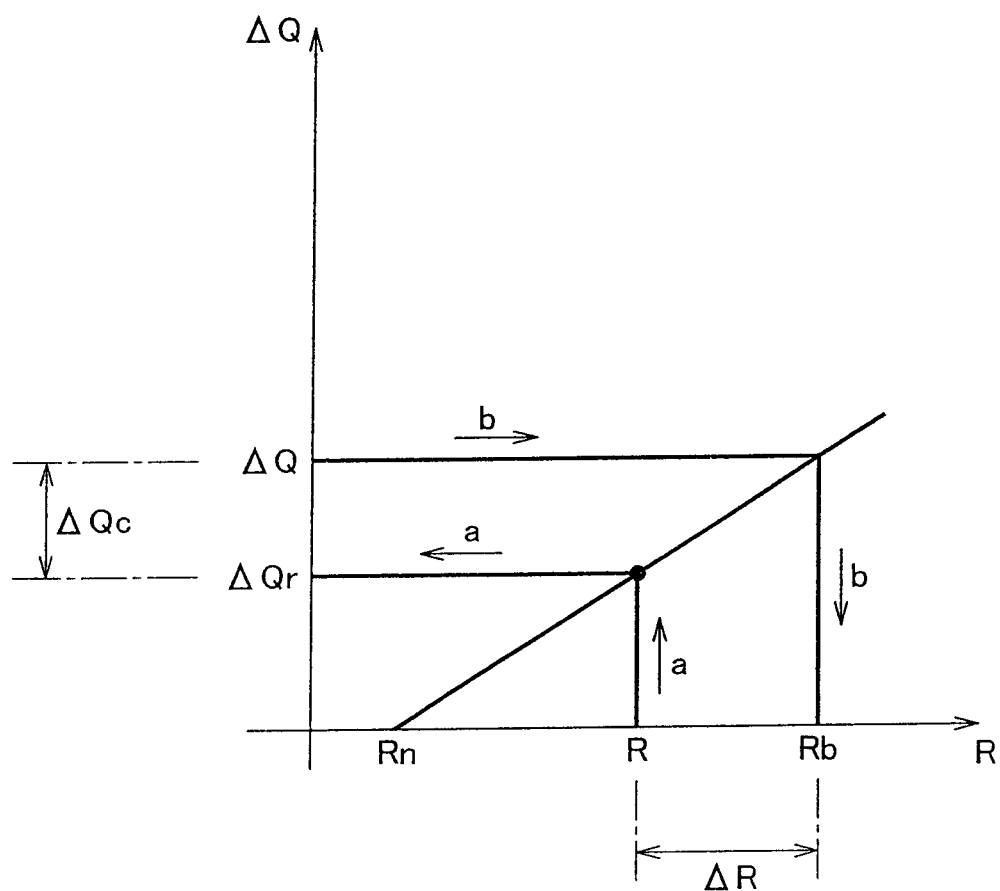
FIG. 5 is a graph of an example of another way to use the correlation map.

For example, as shown by arrow a in FIG. 5, the age-decreased discharge amount $\Delta Qr$ can be obtained from the internal resistance value R and the correlation map 17, and the deposition-decreased discharge amount $\Delta Qc$ can be obtained by taking the difference between the obtained age-decreased discharge amount $\Delta Qr$ and the decreased discharge amount $\Delta Q$. As a result, it is possible to extract only the portion caused by lithium deposition by removing the age-decreased discharge amount $\Delta Qr$ due to age-related deterioration from the decreased discharge amount $\Delta Q$ of the battery 21 that is to be diagnosed.

When there is absolutely no lithium deposition, the decreased discharge amount $\Delta Q$ is equal to the age-decreased discharge amount $\Delta Qr$, so the deposition-decreased discharge amount $\Delta Qc$ equals zero (i.e., $\Delta Qc=0$). The deposition-decreased discharge amount $\Delta Qc$ increases as the amount of deposited lithium increases. In FIG. 3, as lithium deposition progresses, the discharge amount Q becomes smaller and farther away from the age-related discharge amount Qr. The deposition determining portion 15 in this example embodiment determines the degree of lithium deposition from the value of the obtained deposition-decreased discharge amount $\Delta Qc$. Accordingly, the effect from age-related deterioration is eliminated so the degree of lithium deposition can be very accurately determined.

Heretofore, a method for obtaining the deposition-decreased discharge amount $\Delta Qc$, as shown by arrow a in FIG. 5, from the internal resistance value R and the correlation map 17 has been described. However, the way in which the correlation map 17 is used is not limited to this. For example, as shown by arrow b in the drawing, an internal resistance value Rb when the obtained decreased discharge amount ΔQ is assumed to be due to only age-related deterioration may also be read. Then the degree of lithium deposition may be determined using ΔR that is the difference between the internal resistance value R and the internal resistance value Rb.

Figure 6:
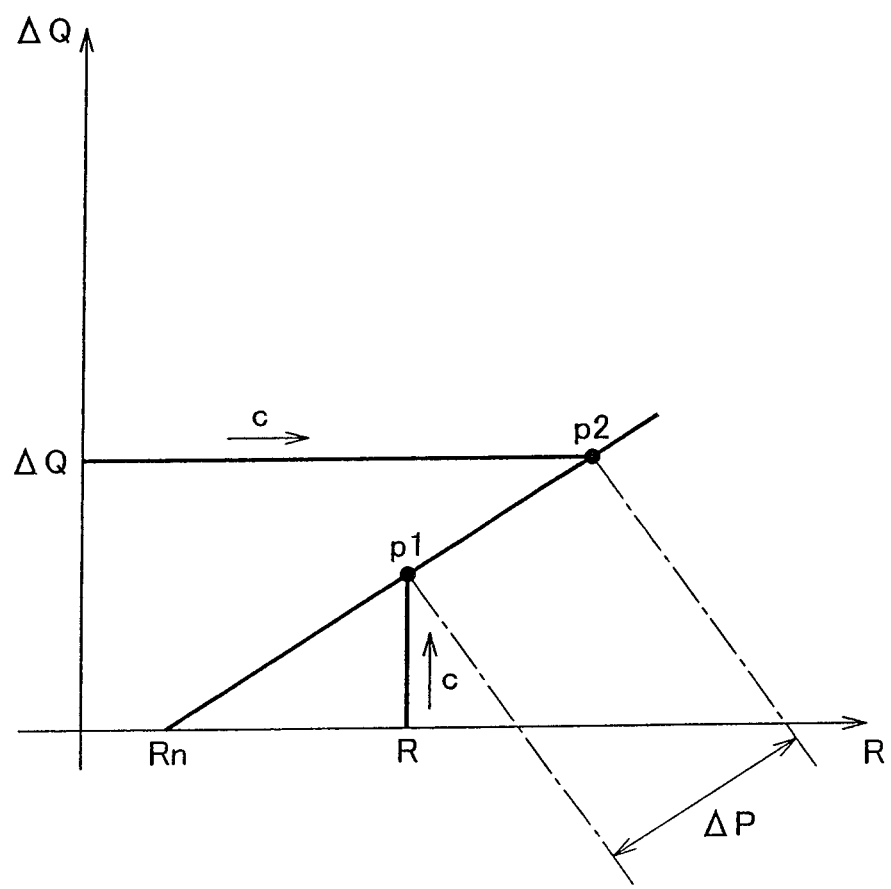
FIG. 6 is a graph of another example of another way to use the correlation map.

Alternatively, as shown by arrow c in FIG. 6, a point p1 on the map that corresponds to the obtained internal resistance value R may be compared with a point p2 on the map that corresponds to the obtained decreased discharge amount ΔQ, and the difference ΔP between these on the map may be obtained. The degree of lithium deposition may then be determined based on this value. For example, the difference between these may be obtained by plotting coordinates on the map. In both examples, the obtained decreased discharge amount ΔQ and the obtained internal resistance value R are compared on the same scale by converting at least one via the correlation map 17.

Furthermore, when there is no deviation in the discharge-amount-when-new Qn such that it can be treated as a fixed value, the discharge amount Q at the time of the determination may be used as the information of the determination zone discharge amount. That is, the difference between the discharge amount Q and the age-related discharge amount Qr may be set as it is as the deposition-decreased discharge amount ΔQc. In this case, the discharge-amount-when-new obtaining portion 16 is not necessary. Regarding this, as described above, the system that compares the discharge amount due to only aged deterioration using the decreased discharge amount ΔQ makes a determination by correcting the determination zone discharge amount of the target battery. Alternatively, the determination may be made by correcting the correlation map, or by correcting the internal resistance value.

Figure 7:
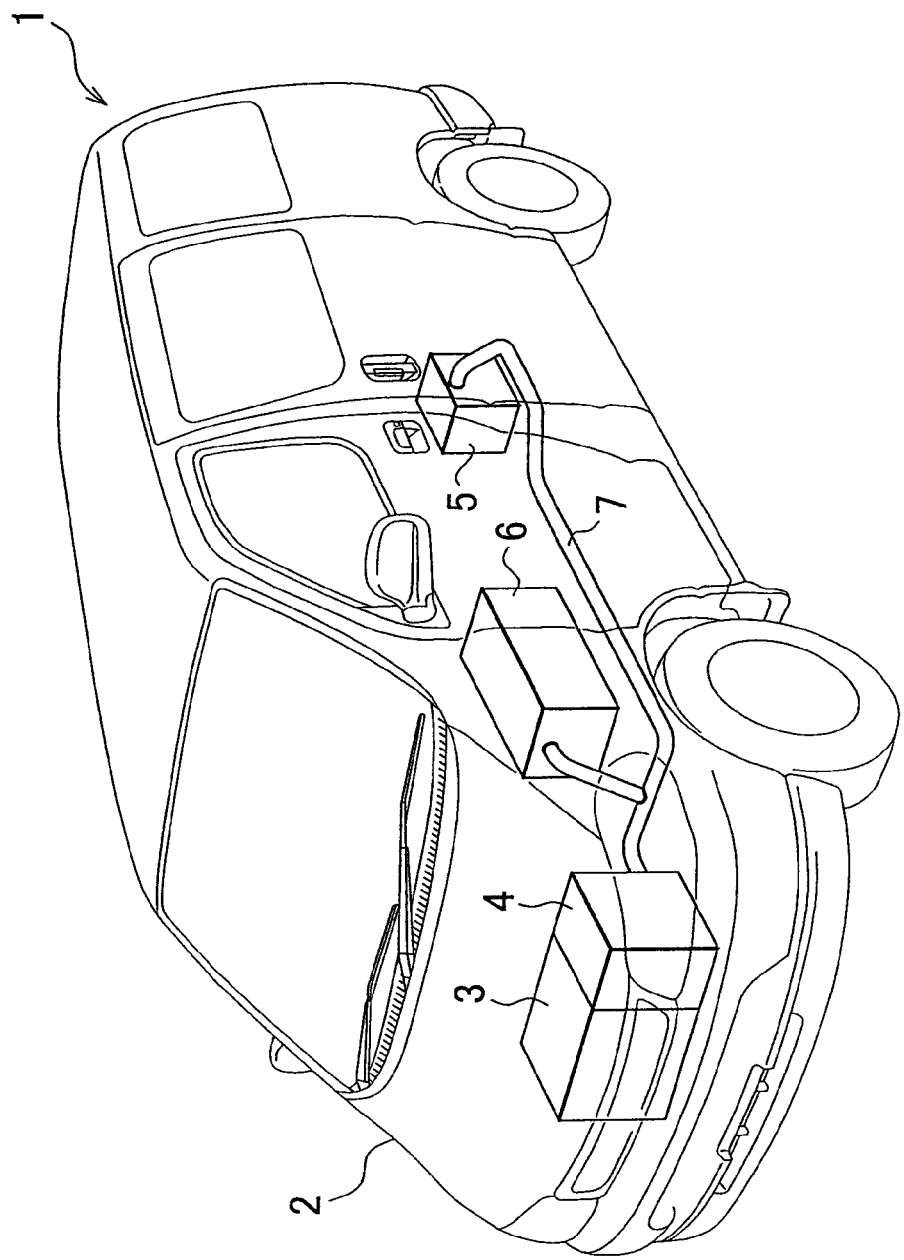
FIG. 7 is a diagram of a vehicle provided with a battery.

Incidentally, the battery system 10 according to the example embodiment described above may be mounted in a hybrid vehicle or another type of vehicle. FIG. 7 is a view of a hybrid vehicle 1 provided with the battery system 10 according to this example embodiment. This hybrid vehicle 1 has an engine 3, a motor 4, a battery pack 5, and a controller 6 mounted to a vehicle body 2. A plurality of the batteries 21 are housed in the battery pack 5. The battery system 10 in this example embodiment is included in the controller 6. That is, in the hybrid vehicle 1, the controller 6 forms the battery system 10.

The hybrid vehicle 1 drives the wheels using both the engine 3 and the motor 4. In the hybrid vehicle 1 of this example embodiment, discharge current of the batteries is supplied from the battery pack 5 to the motor 4, and the motor 4 generates power. Also, depending on the running state of the hybrid vehicle 1, regenerative electromotive force may be generated by the motor 4. As a result, charging current is supplied to the batteries of the battery pack 5 to charge the batteries. Here, the controller 6 controls the sending and receiving of current between the battery pack 5 and the motor 4, so the controller 6 houses a known inverter.

Now the method for obtaining the internal resistance value R in each of the batteries 21 mounted in such a hybrid vehicle 1 will be described. In the determination steps described above, the internal resistance value R is obtained using the set of a voltage value and a current value obtained in the first step (i.e., Step 1). However, when the batteries 21 are discharged for a diagnostic, the discharging is performed at a relatively constant low current, so the current values obtained in this way are all approximately the same. In order to obtain the internal resistance value R more accurately, a certain range may be set for the current value used to calculate the internal resistance value R.

Figure 8:
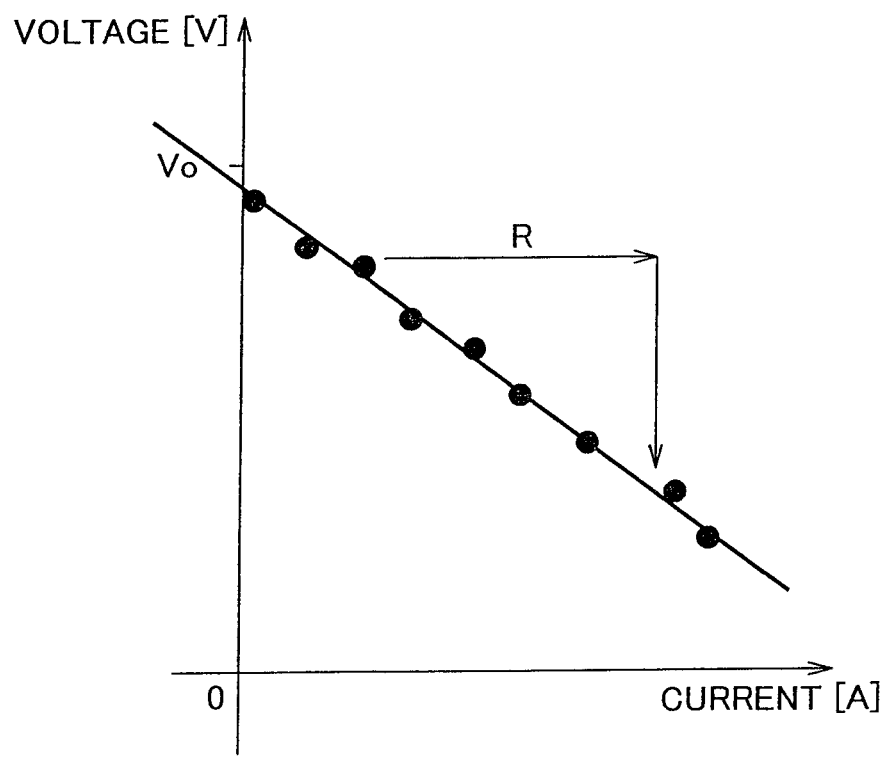
FIG. 8 is a graph of the relationship between a current value and a voltage value of the battery provided in the vehicle.

With the batteries 21 mounted in the hybrid vehicle 1, charging and discharging are performed while running. Therefore, the set of a voltage value and a current value is measured a plurality of times while the batteries 21 are being discharged while running, and the measured values may be stored. When running normally, the current value discharged from the batteries 21 is not near a fixed value, but rather increases and decreases to a large degree depending on the situation, so a certain range of current values are obtained. The relationship among these stored values is as shown in FIG. 8, for example. Therefore, the internal resistance value R can be accurately obtained from the slope of this graph.

However, in the controller 6 provided in the vehicle, there is not inconceivable that data of the measured current and voltage values may be lost or unreliable. For example, there is a chance that temporarily stored data may be lost due to disconnection of an auxiliary battery that supplies power to the controller 6, or that an error may occur while reading the data or the like, or that the measurements of the voltage and current values that are stored may be old due the vehicle not being run for an extended period of time. In such a case, the internal resistance value R may be obtained separately before the diagnostic is performed on the batteries 21. That is, charging or discharging of a degree suitable for obtaining the internal resistance value R may be performed regardless of the running of the vehicle, and the current and voltage values at that time may be measured. Calculating the internal resistance value R from the thus obtained current and voltage values and using this calculated internal resistance value R for the diagnostic enables the diagnostic to be highly accurate.

Incidentally, the vehicle according to this example embodiment of the invention is not limited to a hybrid vehicle as long as it is a vehicle that uses electric energy from a battery as all or part of the power source. For example, the vehicle may also be an electric vehicle, a plug-in hybrid vehicle, a hybrid railcar, a forklift, an electric wheelchair, an electric assisted vehicle, or an electric scooter or the like.

The battery system of this example embodiment as described in detail above obtains the discharge amount Q by discharging the battery 21 from the diagnostic start voltage Vs to the diagnostic end voltage Ve. The battery system then obtains the decreased discharge amount ΔQ from the discharge-amount-when-new Qn, reads the age-decreased discharge amount ΔQr that is the portion of the decreased discharge amount ΔQ that corresponds to age-related deterioration from the correlation map 17, and obtains the deposition-decreased discharge amount ΔQc that is the difference between the age-decreased discharge amount ΔQr and the decreased discharge amount ΔQ. The battery system is then able to determine the degree of lithium deposition based on the size of this deposition-decreased discharge amount ΔQc. Accordingly, the battery system is able to accurately determine the degree of lithium deposition of a non-aqueous electrolyte solution type lithium ion secondary battery in which deterioration has progressed.

In the example embodiment described above, when the temperature of the environment when measuring the current and voltage values in order to obtain the internal resistance value R differs greatly from the temperature of the environment during the diagnostic, the obtained internal resistance value R may also be corrected according to the temperature.

While some embodiments of the invention have been illustrated above, it is to be understood that the invention is not limited to details of the illustrated embodiments, but may be embodied with various changes, modifications or improvements, which may occur to those skilled in the art, without departing from the scope of the invention.

The invention claimed is:

1. A nonaqueous electrolyte solution type lithium ion secondary battery system comprising:
   a discharge amount obtaining portion that obtains a determination zone discharge amount that is a discharge amount when a nonaqueous electrolyte solution type lithium ion secondary battery is discharged from a predetermined determination start voltage until a predetermined determination end voltage;
   an internal resistance obtaining portion that obtains an internal resistance value of the nonaqueous electrolyte solution type lithium ion secondary battery;
   a correlation map in which a combination of internal resistance value information and determination zone discharge amount information for a battery, the battery being a battery in which lithium deposition has not occurred and that is a same kind of battery as a target battery that is the nonaqueous electrolyte solution type lithium ion secondary battery for which a determination is to be made, is stored for each degree of age-related deterioration of the battery in which lithium deposition has not occurred, wherein the age-related deterioration of the battery is an amount of deterioration that occurs due to the nonaqueous electrolyte solution type lithium ion secondary battery not being used; and
   a deposition determining portion that determines a degree of lithium deposition in the target battery by comparing the determination zone discharge amount obtained by the discharge amount obtaining portion when determining the degree of lithium deposition in the target battery with the internal resistance value obtained by the internal resistance obtaining portion when determining the degree of lithium deposition in the target battery on the same scale by converting at least one of the determination zone discharge amount and the internal resistance value via the correlation map.

2. The nonaqueous electrolyte solution type lithium ion secondary battery system according to claim 1, wherein the internal resistance obtaining portion obtains the internal resistance value from a current value and a voltage value when discharging is performed in order to obtain the discharge amount by the discharge amount obtaining portion.

3. The nonaqueous electrolyte solution type lithium ion secondary battery system according to claim 1, further comprising:
   a discharge-amount-when-new obtaining portion that obtains the determination zone discharge amount when the target battery is new,
   wherein the deposition determining portion determines the degree of the lithium deposition in the target battery based on a difference between a determination-zone-discharge-amount-when-new that is the determination zone discharge amount obtained by the discharge-amount-when-new obtaining portion and the determination zone discharge amount.

4. The nonaqueous electrolyte solution type lithium ion secondary battery system according to claim 3, wherein a decreased discharge amount that is a value of a difference between the determination-zone-discharge-amount-when-new and the determination zone discharge amount is used as a determination zone discharge amount information in the correlation map; and the deposition determining portion determines the degree of lithium deposition in the target battery according to an increase or decrease amount that is a value of a difference between the decreased discharge amount when determining the degree of lithium deposition in the target battery and the determination zone discharge amount information read from the correlation map based on the internal resistance value when determining the degree of lithium deposition in the target battery.

5. The nonaqueous electrolyte solution type lithium ion secondary battery system according to claim 4, wherein the deposition determining portion determines that the degree of lithium deposition is large when the increase or decrease amount is large, and determines that the degree of lithium deposition is small when the increase or decrease amount is small.

6. The nonaqueous electrolyte solution type lithium ion secondary battery system according to claim 1, further comprising:
   a correlation map storing portion in which the correlation map is stored.

7. The nonaqueous electrolyte solution type lithium ion secondary battery system according to claim 1, wherein the target battery is the nonaqueous electrolyte solution type lithium ion secondary battery in which the determination zone discharge amount is obtained by the discharge amount obtaining portion and the internal resistance value is obtained by the internal resistance obtaining portion.

8. A vehicle provided with the nonaqueous electrolyte solution type lithium ion secondary battery system according to claim 1.

9. The vehicle according to claim 8, comprising:
   a voltage and current obtaining portion that measures a set of a voltage value and a current value of the nonaqueous electrolyte solution type lithium ion secondary battery while the vehicle is running, and stores the obtained set,
   wherein when two or more of the sets are stored in the voltage and current obtaining portion, the internal resistance obtaining portion obtains the internal resistance value based on the sets stored in the voltage and current obtaining portion, and when two or more of the sets are not stored in the voltage and current obtaining portion, the internal resistance obtaining portion obtains a plurality of sets of voltage and current values by charging and discharging the nonaqueous electrolyte solution type lithium ion secondary battery while the vehicle is not running and obtains the internal resistance value based on those values.

10. A method for determining lithium deposition in a nonaqueous electrolyte solution type lithium ion secondary battery system, comprising:
   preparing a correlation map in which a combination of internal resistance value information and determination zone discharge amount information for a battery, the battery being a battery in which lithium deposition has not occurred and that is a same kind of battery as a target battery, is stored for each degree of age-related deterioration of the battery in which lithium deposition has not occurred, wherein the age-related deterioration of the battery is an amount of deterioration that occurs due to the nonaqueous electrolyte solution type lithium ion secondary battery not being used;
   obtaining a determination zone discharge amount and an internal resistance value when determining a degree of lithium deposition, for the target battery; and
   determining the degree of lithium deposition in the target battery by comparing the obtained determination zone discharge amount with the obtained internal resistance value on the same scale by converting at least one of the determination zone discharge amount and the internal resistance value via the correlation map.

11. The method for determining lithium deposition according to claim 10, wherein the target battery is a nonaqueous electrolyte solution type lithium ion secondary battery.

12. The nonaqueous electrolyte solution type lithium ion secondary battery system according to claim 1, wherein the deposition determining portion obtains from the correlation map the determination zone discharge amount of the battery in which lithium deposition has not occurred corresponding to the internal resistance value obtained by the internal resistance obtaining portion; and wherein the deposition determining portion determines the degree of lithium deposition in the target battery based on the determination zone discharge amount obtained by the discharge amount obtaining portion and the determination zone discharge amount of the battery in which lithium deposition has not occurred.

\* \* \* \* \*